US010939560B1

(12) United States Patent
Hornung et al.

(10) Patent No.: US 10,939,560 B1
(45) Date of Patent: Mar. 2, 2021

(54) ADJUSTABLE HEIGHT DATA TRANSMISSION CONTACT

(71) Applicants: TE Connectivity Services GmbH, Schaffhausen (CH); TYCO ELECTRONICS JAPAN G.K., Kawasaki (JP)

(72) Inventors: Craig Warren Hornung, Harrisburg, PA (US); Chad William Morgan, Carneys Point, NJ (US); Hiroshi Shirai, Saitama (JP); John Joseph Consoli, Harrisburg, PA (US)

(73) Assignees: TYCO ELECTRONICS JAPAN G.K., Kawasaki (JP); TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/935,556

(22) Filed: Jul. 22, 2020

(51) Int. Cl.
*H05K 3/34* (2006.01)
*H05K 1/14* (2006.01)
*H05K 1/11* (2006.01)

(52) U.S. Cl.
CPC .......... *H05K 3/3436* (2013.01); *H05K 1/111* (2013.01); *H05K 1/141* (2013.01); *H05K 2201/10734* (2013.01)

(58) Field of Classification Search
CPC ...... H05K 3/3436; H05K 1/111; H05K 1/141; H05K 2201/10734
USPC ......................................................... 174/260
See application file for complete search history.

(56) References Cited

U.S. PATENT DOCUMENTS

| 5,069,627 | A | * | 12/1991 | Buck | H01R 12/714 439/66 |
| 6,024,579 | A | * | 2/2000 | Bennett | H01R 13/2435 439/289 |
| 9,276,339 | B2 | | 3/2016 | Rathburn | |
| 2019/0103962 | A1 | * | 4/2019 | Howe | H04L 63/062 |
| 2019/0173207 | A1 | * | 6/2019 | Ju | H01R 13/46 |

* cited by examiner

*Primary Examiner* — Sherman Ng

(57) ABSTRACT

An electrical connector assembly includes a contact organizer having a substrate having a lower surface facing the host circuit board and an upper surface facing a component circuit board. The electrical connector includes data transmission contacts each including a main body, a upper mating element extending from the main body top mated to the component circuit board, and a lower mating element extending from the main body bottom soldered to the host circuit board. The main body includes a main body length between the top and the bottom and an adjustable height section to adjust a height of the main body between the top and the bottom. The adjustable height sections of the data transmission contacts are varied to adjust vertical positions of at least one of the upper mating element or the lower mating element such that the contacts have variable heights.

30 Claims, 9 Drawing Sheets

ADJUSTABLE HEIGHT DATA TRANSMISSION CONTACT

BACKGROUND OF THE INVENTION

The subject matter herein relates generally to electrical contacts for electrical connectors.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. A socket connector may include a substrate holding an array of contacts having beam contacts on one side of the substrate and conductive solder elements, such as a ball grid array (BGA), on the opposite side. The beam contacts engage contacts on the electronic package and the solder elements are affixed to conductive pads on a host circuit board, such as a mother board, to electrically join the electronic package with the host circuit board. The socket connectors are designed to meet certain flatness requirements for mating with the electronic package at the top and the host circuit board at the bottom. However, it is common for both the electronic package and the host circuit board to fall outside of the flatness requirements, such as due to manufacturing tolerances as well as warpage that occurs due to heating during soldering and operation of the system. Warpage in the host circuit board may lead to poor soldering connections between the host circuit board and the contacts due to insufficient solder material due to large gaps between the contacts and the pads of the host circuit board and/or may strain the solder connections between the contacts and the pads of the host circuit board. Additionally, the warpage in the host circuit board may be transferred to the socket connector due to the mechanical connection between the socket connector and the host circuit board, leading to warpage in the socket connector and thus misalignment of the beam contacts with the electronic package. While the beam contacts are designed to have a certain amount of deflection in the vertical direction to accommodate alignment with the electronic package and to accommodate the compressive mating with the electronic package, excessive warpage of the electronic package or the socket connector may position the beam contacts outside of the working range of deflection of the beam contacts leading to insufficient normal force to maintain proper electrical connection between the socket connector and the electronic package. Additionally, increases in connector footprint sizes to provide a greater number of contacts further exaggerates the alignment problems associated with warpage.

A need remains for a board-to-board electrical connector assembly having improved contact interfaces with the upper and lower circuit boards.

BRIEF DESCRIPTION OF THE INVENTION

In one embodiment, a board-to-board electrical connector assembly for electrically connecting a component circuit board of an electrical component with a host circuit board is provided. The board-to-board electrical connector includes a contact organizer having a substrate including an upper surface and a lower surface. The lower surface is configured to face the host circuit board. The upper surface is configured to face the component circuit board. The substrate includes a plurality of contact channels extending between the upper surface and the lower surface. The board-to-board electrical connector includes data transmission contacts received in corresponding contact channels. Each data transmission contact includes a main body extending between a top and a bottom. An upper mating element extends from the top of the main body to an upper mating interface configured to be mated to the component circuit board and a lower mating element extends from the bottom of the main body to a lower mating interface configured to be mated to the host circuit board. The data transmission contacts have variable heights such that the upper mating interfaces are non-coplanar to correspond to the expected non-coplanar warpage profile of the component circuit board.

In another embodiment, a board-to-board electrical connector assembly for electrically connecting a component circuit board of an electrical component with a host circuit board is provided. The board-to-board electrical connector includes a contact organizer having a substrate including an upper surface and a lower surface. The lower surface is configured to face the host circuit board. The upper surface is configured to face the component circuit board. The substrate includes a plurality of contact channels extending between the upper surface and the lower surface. The board-to-board electrical connector includes data transmission contacts received in corresponding contact channels. Each data transmission contact includes a main body extending between a top and a bottom. An upper mating element extends from the top of the main body and is configured to be mated to the component circuit board at a mating interface. A lower mating element extends from the bottom of the main body and is configured to be mated to the host circuit board. The main body includes a main body length between the top and the bottom. The main body includes an adjustable height section between the top and the bottom of the main body to adjust a height of the main body between the top and the bottom. The data transmission contacts are loaded into the contact channels of the substrate such that the tops of the data transmission contacts are coplanar. The adjustable height sections of the data transmission contacts are varied to adjust vertical positions of at least one of the upper mating element or the lower mating element such that the contacts have variable heights.

In another embodiment, a board-to-board electrical connector assembly for electrically connecting a component circuit board of an electrical component with a host circuit board is provided. The board-to-board electrical connector includes a contact organizer having a substrate including an upper surface and a lower surface. The lower surface is configured to face the host circuit board. The upper surface is configured to face the component circuit board. The substrate includes a plurality of contact channels extending between the upper surface and the lower surface. The board-to-board electrical connector includes a first data transmission contact received in the corresponding contact channel. The first data transmission contact includes a first main body extending between a top and a bottom. A first upper mating element extends from the top of the first main body and is configured to be mated to the component circuit board at a first mating interface. A first lower mating element extends from the bottom of the first main body and is configured to be mated to the host circuit board. The first main body has an adjustable height section between the top and the bottom. The adjustable height section includes a first jogged section that transitions out of a main body plane of the first main body. The first jogged section has a first depth to control a first height of the first main body between the top and the bottom. A second data transmission contact is received in the corresponding contact channel. The second data transmission contact includes a second main body extending between a top and a bottom. A second upper mating element extends from the top of the second main body and is configured to be mated to the component circuit board at a second mating interface. A second lower mating element extends from the bottom of the second main body and is configured to be mated to the host circuit board. The second main body has an adjustable height section between the top and the bottom. The adjustable height section includes a second jogged section that transitions out of a main body plane of the second main body. The second jogged section has a second depth to control a second height of the second main body between the top and the bottom. The first depth of the first jogged section is deeper than the second depth of the second jogged section such that a first height of the first main body is shorter than a second height of the second main body.

In a further embodiment, a data transmission contact is provided. The data transmission contact includes a main body extending between a top and a bottom. A upper mating element extends from the main body at the top of the main body. The upper mating element has a proximal end at the main body and a distal end opposite the proximal end. The upper mating element has a mating interface at the distal end configured to be mated to an electrical component. A lower mating element extends from the main body at the bottom of the main body. The lower mating element is configured to be mated to a board contact on a surface of a host circuit board. An adjustable height section of the main body is between the top and the bottom of the main body. The adjustable height section has a transition that transitions out of a main body plane of the main body. A shape of the transition is controlled during a forming process to vary a height of the main body between the top and the bottom of the main body.

DETAILED DESCRIPTION OF THE INVENTION

Figure 1:
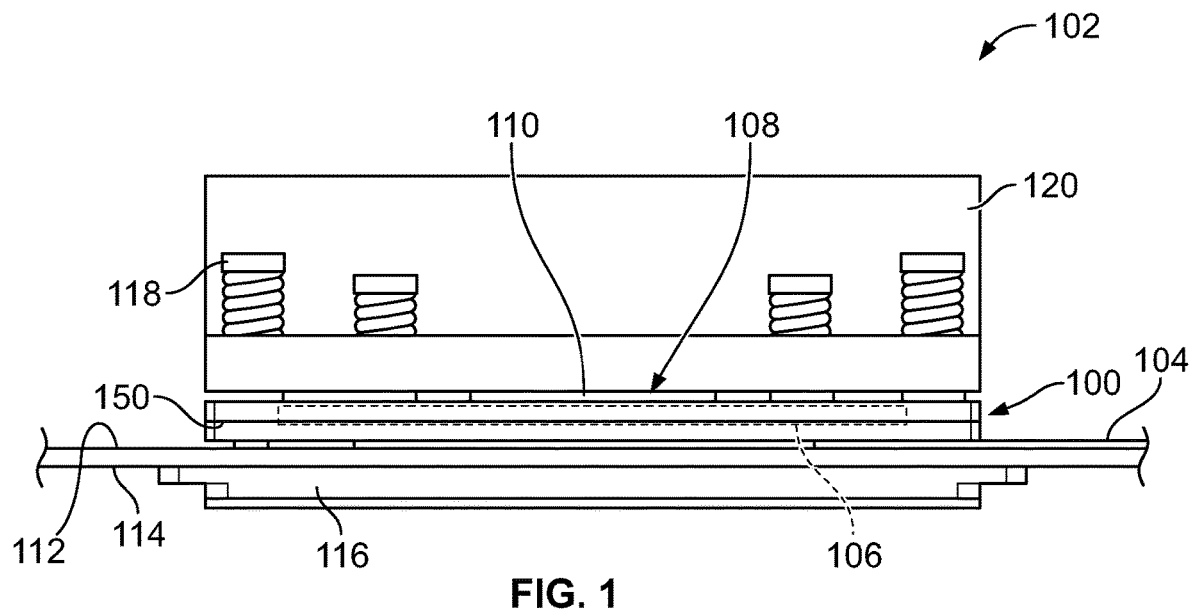
FIG. 1 is a side view of a board-to-board electrical connector assembly in accordance with an exemplary embodiment for an electrical system.
Figure 2:
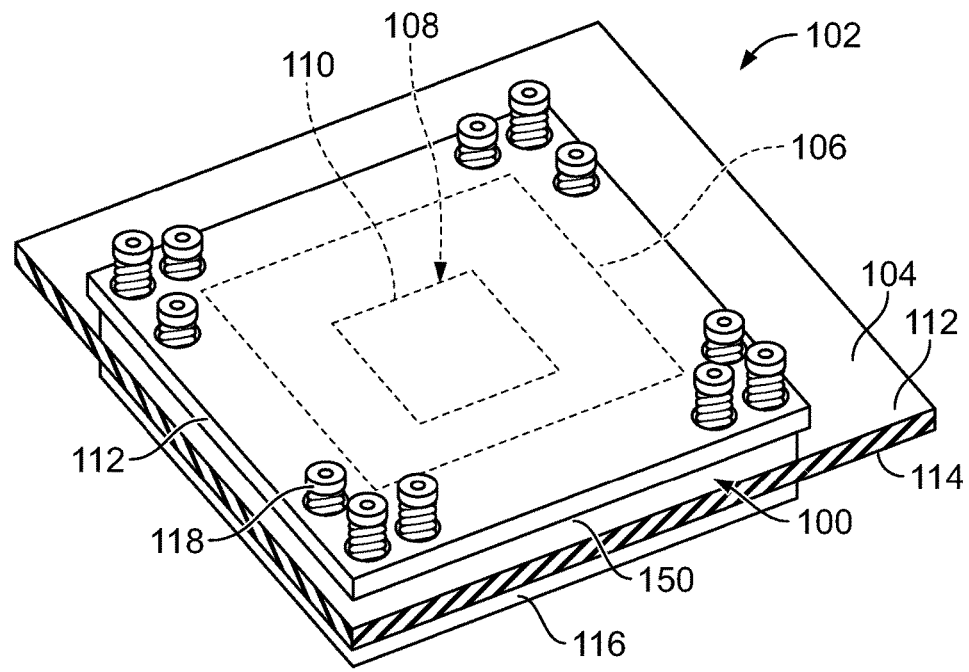
FIG. 2 is a top perspective view of the board-to-board electrical connector assembly electrical system in accordance with an exemplary embodiment.

FIG. 1 is a side view of a board-to-board electrical connector assembly 100 in accordance with an exemplary embodiment for an electrical system 102. FIG. 2 is a top perspective view of the board-to-board electrical connector assembly 100 of the electrical system 102 in accordance with an exemplary embodiment. The electrical system 102 includes a host circuit board 104 and a component circuit board 106 (shown in phantom) of the electrical component 108. The board-to-board an electrical connector assembly 100 is used to electrically connect the component circuit board 106 with the host circuit board 104. In various embodiments, the electrical component 108 is an electronic package, such as an ASIC. For example, the electrical component 108 may include a chip 110 mounted to the component circuit board 106.

The host circuit board 104 includes an upper surface 112 and a lower surface 114. The electrical connector assembly 100 is mounted to the upper surface 112 of the host circuit board 104. In an exemplary embodiment, a backer plate 116 is provided at the lower surface 114 to stiffen the host circuit board 104. The electrical connector assembly 100 may be coupled to the backer plate 116 through the host circuit board 104, such as using fasteners 118.

In an exemplary embodiment, a thermal plate 120 (FIG. 1) is thermally coupled to the electrical component 108 to dissipate heat from the electrical component 108. For example, the plate 120 may be used to dissipate heat from the chip 110. The thermal plate 120 may be a heatsink or a cold plate in various embodiments. Other types of thermal plates may be used in alternative embodiments. The plate 120 may be coupled to the electrical connector assembly 100 and/or the host circuit board 104 and/or the backer plate 116 in various embodiments.

Figure 5:
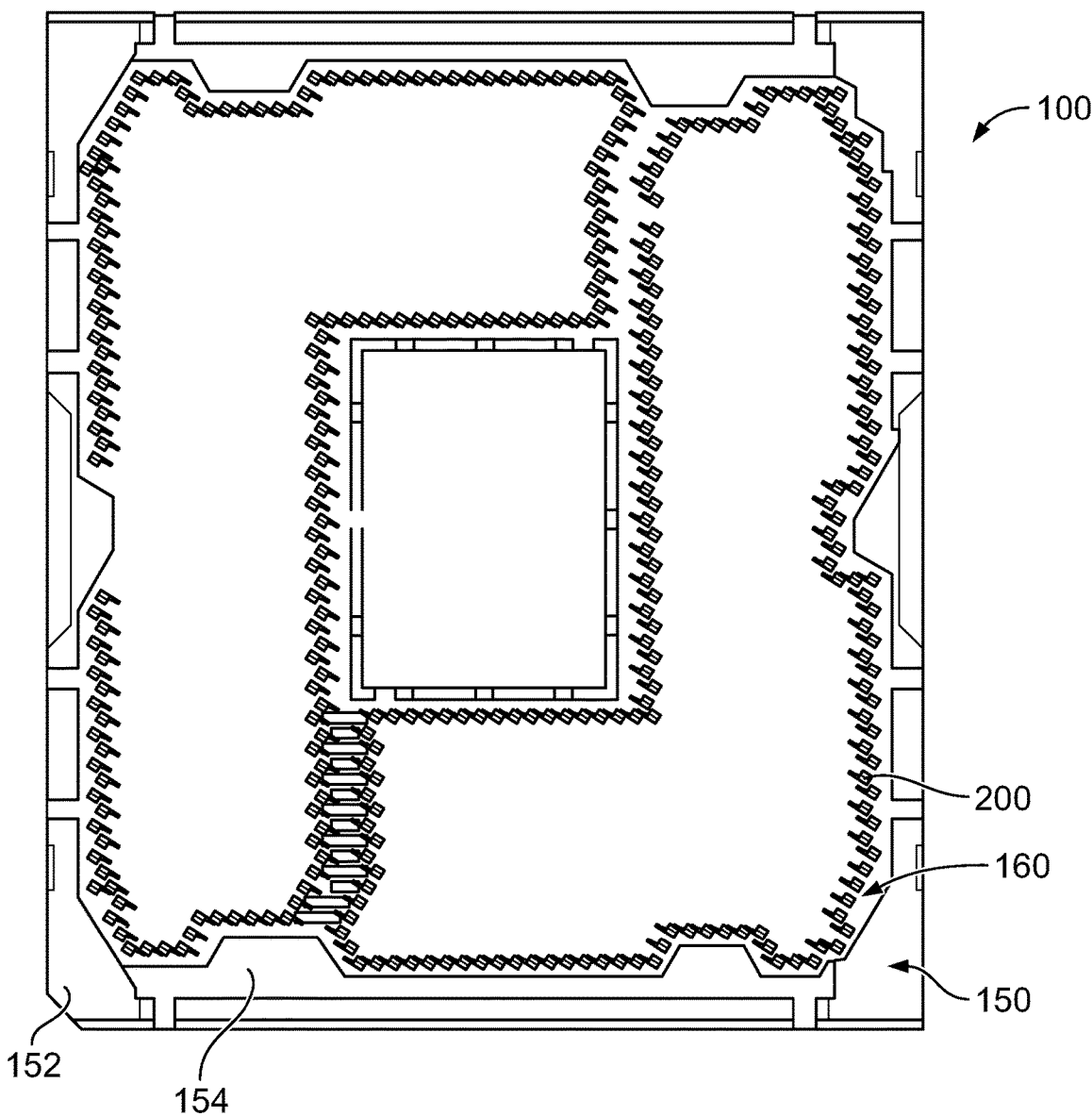
FIG. 5 is a top view of the electrical connector assembly in accordance with an exemplary embodiment.

In an exemplary embodiment, the connector assembly 100 includes a frame 150 that holds a plurality of data transmission contacts 200 (shown in FIG. 5). The data transmission contacts 200 are configured to be electrically connected to the host circuit board 104 and are configured to be electrically connected to the component circuit board 106 to transmit data signals therebetween. In various embodiments, the frame 150 may hold other types of contacts, such as ground contacts and/or power contacts. The contacts are held in an array. In an exemplary embodiment, the array of contacts is configured to be coupled to the component circuit board 106 at a separable interface, such as using spring beams having deflectable beam interfaces. For example, the electrical connector assembly 100 may form a land grid array at the component circuit board interface. In an exemplary embodiment, the array of contacts is configured to be coupled to the component circuit board 106 at a solder interface, such as using solder balls. For example, the electrical connector assembly 100 may form a ball grid array at the host circuit board interface.

In various embodiments, the frame 150 may be a multi-piece frame. The frame 150 may include an inner frame or a substrate used to hold the contacts 200 and an outer frame that holds the frame. The outer frame may form a pocket that receives the component circuit board 106. The outer frame may be used to position the component circuit board 106 relative to the inner frame and the contacts 200. The outer frame may be secured to the backer plate 116 using fasteners 118. The thermal plate 120 may be coupled to the outer frame. Optionally, the outer frame may position the plate 120 relative to the electrical component 108, such as to limit compression of the thermal plate 120 against the electrical component 108. In alternative embodiments, the frame 150 may be provided without the outer frame.

Figure 3:
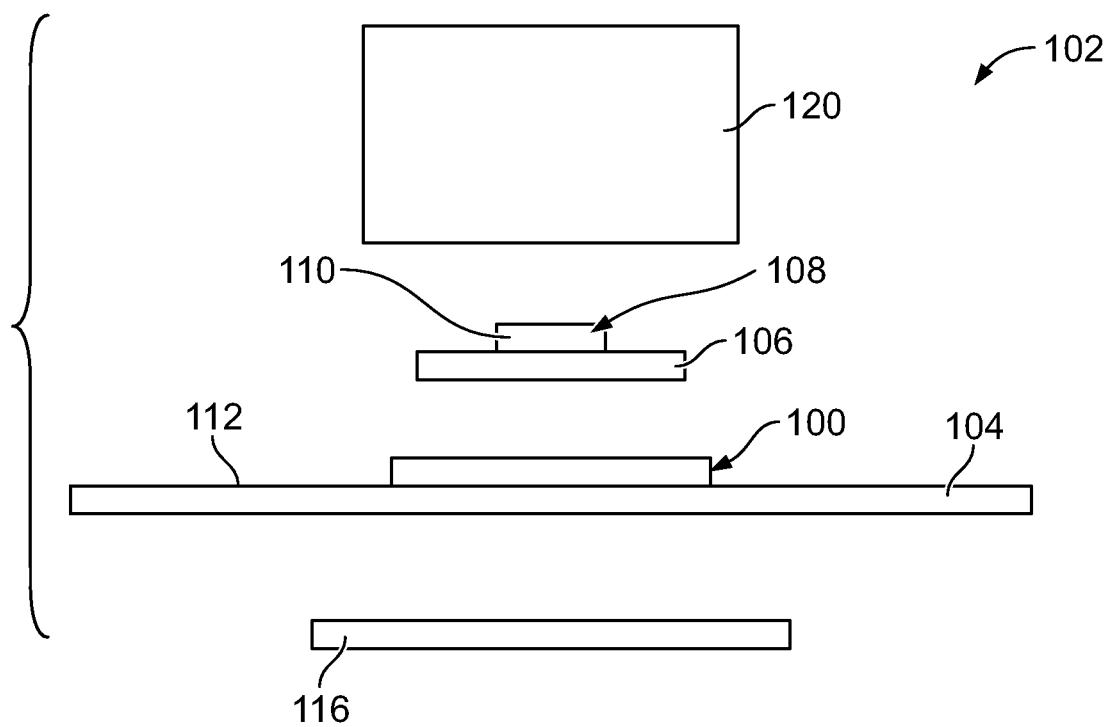
FIG. 3 is an exploded view of the electrical system in accordance with an exemplary embodiment.

FIG. 3 is an exploded view of the electrical system 102 in accordance with an exemplary embodiment. The connector assembly 100 may be coupled to the upper surface 112 of the host circuit board 104. The contacts of the electrical connector assembly 100 may be soldered to the host circuit board 104. The electrical component 108 is configured to be coupled to the top of the electrical connector assembly 100. In an exemplary embodiment, the electrical connector assembly 100 includes a compressible interface for receiving the electrical component 108. The component circuit board 106 may be directly coupled to the electrical connector assembly 100. The electrical connector assembly 100 is electrically connected to the chip 110 through the component circuit board 106. In an exemplary embodiment, the thermal plate 120 is coupled to the top of the chip 110 to dissipate heat from the chip 110. The backer plate 116 may be used to secure the thermal plate 120 and/or the electrical component 108 and/or the electrical connector assembly 100 to the host circuit board 104.

Figure 4:
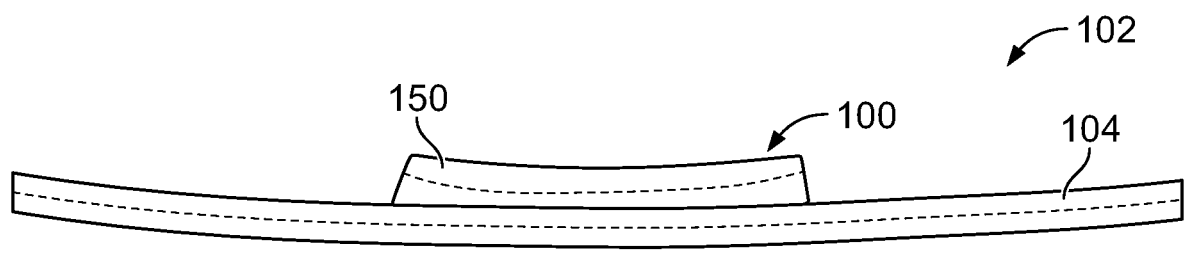
FIG. 4 is a side view of a portion of the electrical system showing the electrical connector assembly coupled to the host circuit board in accordance with an exemplary embodiment.

FIG. 4 is a side view of a portion of the electrical system 102 showing the electrical connector assembly 100 coupled to the host circuit board 104. During manufacture and use, the component circuit board 106 is susceptible to warpage. For example, during the soldering process of soldering the electrical connector assembly 100 to the component circuit board 106, the heat from the soldering process may cause warpage in the component circuit board 106. Additionally or alternatively, during use, the components of the electrical system 102 may generate heat. For example, heat is generated as data signals and/or power signals are transmitted through the host circuit board 104 and/or through the electrical connector assembly 100 and/or through the electrical component 108 (shown in FIG. 3). The heat from operation may cause warpage in the component circuit board 106. The warpage leads to non-planarity of the component circuit board 106 at the interface with the electrical connector assembly 100. The host circuit board 104 may additionally be susceptible to warpage.

The contacts of the electrical connector assembly 100 are designed to accommodate a certain amount of warpage. For example, the spring beams at the top of the contacts defining the compressible, separable interface with the electrical component 108 may accommodate for some of the warpage. However, the warpage may be excessive beyond the design limits of conventional contacts. Additionally, the warpage may be non-uniform across the interface. For example, the area near the center of the electrical connector assembly 100 or the areas at the sides of the electrical assembly 100 may experience greater warpage than other areas. The warpage pattern of the component circuit board 106 may be dependent on the location of the power contacts versus the high-speed data signal contacts versus the low speed data signal contacts. The warpage profile of the component circuit board 106 may be generally known based on the contact layout.

In an exemplary embodiment, the electrical connector assembly 100 may be designed to accommodate for the expected warpage profile. For example, the contacts may be lengthened in certain areas or shortened in certain areas to accommodate for the expected warpage profile of the component circuit board 106. In an exemplary embodiment, the contacts may be lengthened or shortened without changing the stamping profile the contacts. For example, the contacts may be lengthened or shortened by particular forming processes to achieve longer or shorter contacts as desired for placement at particular locations within the electrical connector assembly 100. The contacts may be set at different positions within the substrate using tooling to control the vertical positions of the contacts.

Figure 6:
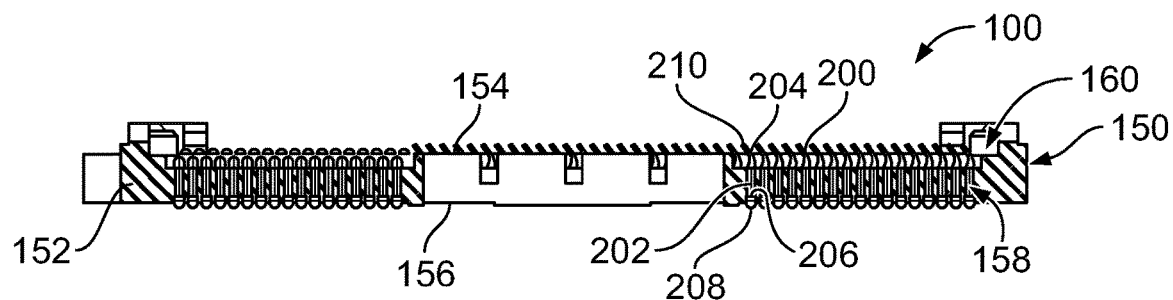
FIG. 6 is a cross-sectional view of the electrical connector assembly in accordance with an exemplary embodiment.

FIG. 5 is a top view of the electrical connector assembly 100 in accordance with an exemplary embodiment. FIG. 6 is a cross-sectional view of the electrical connector assembly 100 in accordance with an exemplary embodiment. The electrical connector assembly 100 includes the frame 150. The data transmission contacts 200 are held by the frame 150. Only a subset of the data transmission contacts are illustrated in FIG. 5 for clarity. Optionally, substantially the entire frame 150 may be populated with the data transmission contacts 200. In various embodiments, the frame 150 may hold the ground contacts and/or power contacts.

The frame 150 includes a substrate 152 having an upper surface 154 and a lower surface 156. The lower surface 156 is configured to face the host circuit board 104 (shown in FIG. 3). The upper surface 154 is configured to face the electrical component 108 (shown in FIG. 3). In an exemplary embodiment, the frame 150 has a pocket 160 at the upper surface 154 that receives the electrical component 108.

The substrate 152 includes a plurality of contact channels 158 extending between the upper surface 154 and the lower surface 156. The contact channels 158 receive the data transmission contacts 200 (and may receive corresponding ground contacts or power contacts when provided). In an exemplary embodiment, each data transmission contact 200 includes a main body 202, an upper mating element 204 extending from the main body 202 at the top of the data transmission contact 200, and a lower mating element 206 extending from the main body 202 at the bottom of the data transmission contact 200. In various embodiments, the upper mating elements 204 have contact beams and may be referred to herein as contact beams 204. The contact beams 204 may form a LGA. In various embodiments, the lower mating elements 206 have contact beams forming a LGA. In alternative embodiments, the lower mating elements 206 have solder pads 206 and may be referred to herein as solder pads 206. The solder pads 206 receive solder balls 208 and form a BGA for the host circuit board 104. The solder pads 206 and the solder balls 208 are provided below the lower surface 156. The contact beams 204 include separable mating interfaces 210 at the top of the data transmission contact 200 defining a land grid array interface for the components circuit board 106. The separable mating interfaces 210 are located above the upper surface 154.

In an exemplary embodiment, heights of the data transmission contacts 200 may be adjustable to vary the vertical positions of the contact beams 204 and/or the solder pads 206. The vertical positions of the contact beams 204 may be varied relative to the upper surface 154 of the substrate 152, such as for matching the expected warpage profile of the component circuit board 106. The vertical positions of the solder pads 206 may be varied relative to the lower surface 156 of the substrate 152, such as for matching the expected warpage profile of the host circuit board 104.

Figure 7:
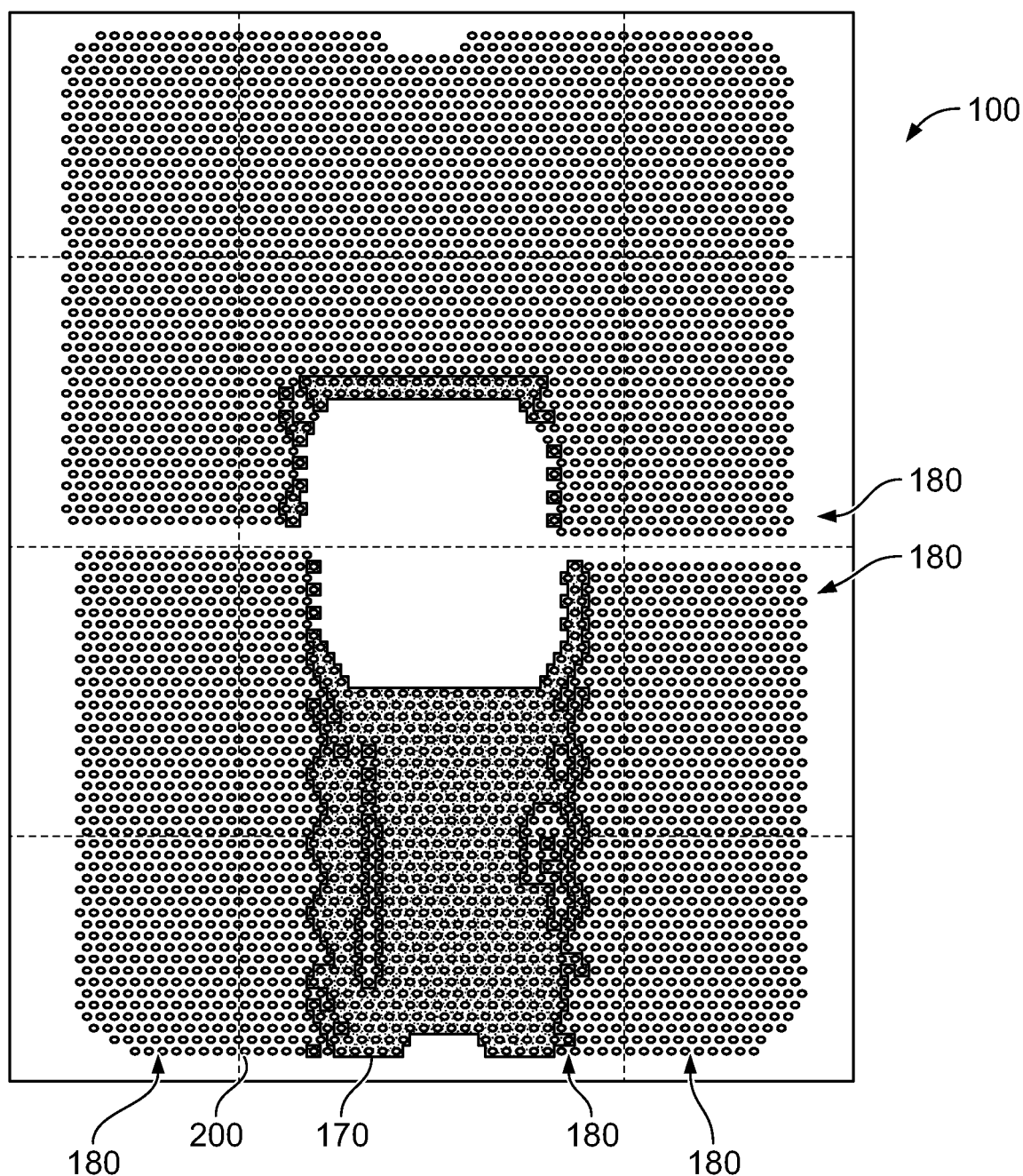
FIG. 7 is a bottom view of the electrical connector assembly in accordance with an exemplary embodiment.

FIG. 7 is a bottom view of the electrical connector assembly 100 in accordance with an exemplary embodiment. FIG. 7 illustrates the data transmission contacts 200 in an array having a particular pattern or pin out. In the illustrated embodiment, the electrical connector assembly 100 includes an array of power contacts 170 interspersed with the data transmission contacts 200. In the illustrated embodiment, the power contacts 170 are generally provided near a center of the electrical connector assembly 100 and the data transmission contacts 200 are provided around the perimeter of the electrical connector assembly 100. Other arrangements are possible in alternative embodiments.

In an exemplary embodiment, the electrical connector assembly 100 may be divided into zones or areas 180. The areas 180 may be divided longitudinally and/or laterally. In an exemplary embodiment, the data transmission contacts 200 within the different areas 180 may have different heights. For example, the data transmission contacts 200 may be taller in the central zones and shorter in the outer or perimeter zones. Alternatively, the data transmission contacts 200 may be shorter in the central zones and taller in the outer or perimeter zones. The heights of the data transmission contacts 200 may be selected to correspond to the expected warpage of the component circuit board 106 to more closely match the interface between the electrical connector assembly 100 and the component circuit board 106. The power contacts 170 may have different heights than the data transmission contacts 200. For example, because more heat is generated in the area of the power contacts 170, greater warpage of the component circuit board 106 may occur in the vicinity of the power contacts 170. The heights of the power contacts 170 and of the data transmission contacts 200 and the vicinity of the power contacts 170 may be different than the heights of the data transmission contacts 200 that are most remote from the power contacts 170.

Figure 8:
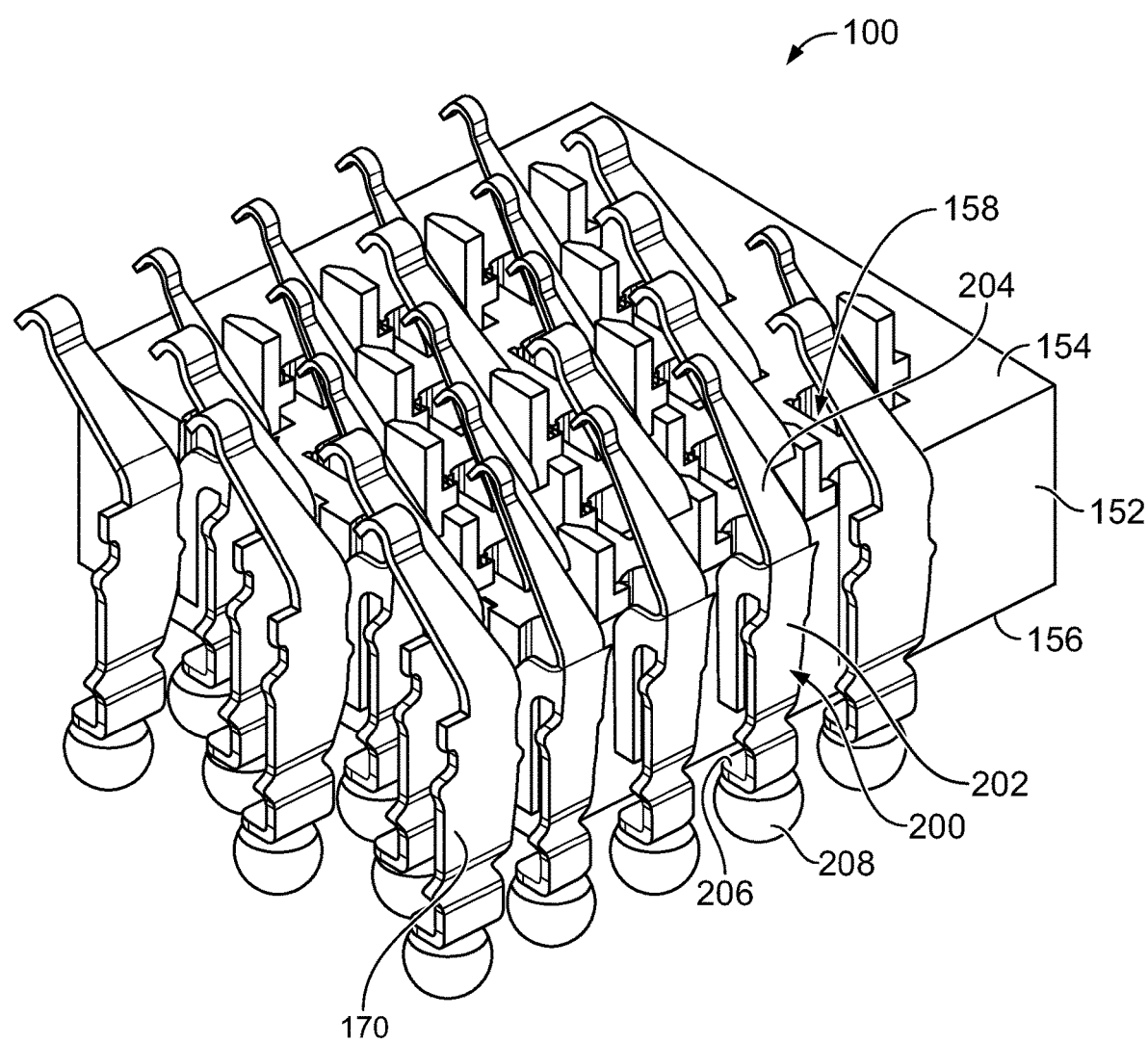
FIG. 8 is a partial sectional view of a portion of the electrical connector assembly in accordance with an exemplary embodiment.

FIG. 8 is a partial sectional view of a portion of the electrical connector assembly 100 in accordance with an exemplary embodiment. FIG. 8 illustrates the substrate 152 used to hold the data transmission contacts 200 and the power contacts 170. The substrate 152 includes the contact channels 158 extending between the upper surface 154 and the lower surface 156. The data transmission contacts 200 and the power contacts 170 are received in corresponding contact channels 158. In an exemplary embodiment, the contacts 200, 170 are configured to be loaded or stitched into the contact channels 158, such as from above. The contact beams 204 extend above the upper surface 154 for mating with the components circuit board 106 (shown in FIG. 3). In an exemplary embodiment, the contact beams 204 may be compressible toward the upper surface 154 when mated with the components circuit board 106. The solder pads 206 are provided at or below the lower surface 156 for soldering to the host circuit board 104, such as using the solder balls 208. Optionally, the solder pads 206 may be arranged to be coplanar for mating to the host circuit board 104. Alternatively, the contacts 200 may be manufactured and assembled to the substrate 150 to vary the vertical positions of the solder pads 206 relative to the lower surface 156.

The power contacts 170 may be interspersed between and among the data transmission contacts 200. In an exemplary embodiment, the power contacts 170 may be sized and shaped differently than the data transmission contacts 200. For example, the power contacts 170 may be thicker and/or wider than the data transmission contacts 200 to handle power transmission as opposed to data transmission. In an exemplary embodiment, the data transmission contacts 200 are variable or adjustable height data transmission contacts. For example, heights of the main bodies 202 of the data transmission contacts 200 may be varied to adjust the heights between the solder pads 206 and the contact beams 204. As such, the vertical positions of the contact beams 204 relative to the solder pads 206 may be varied, such as to correspond to the warpage profile of the component circuit board 106. In an exemplary embodiment, the power contacts 170 are variable or adjustable height power contacts.

Figure 10:
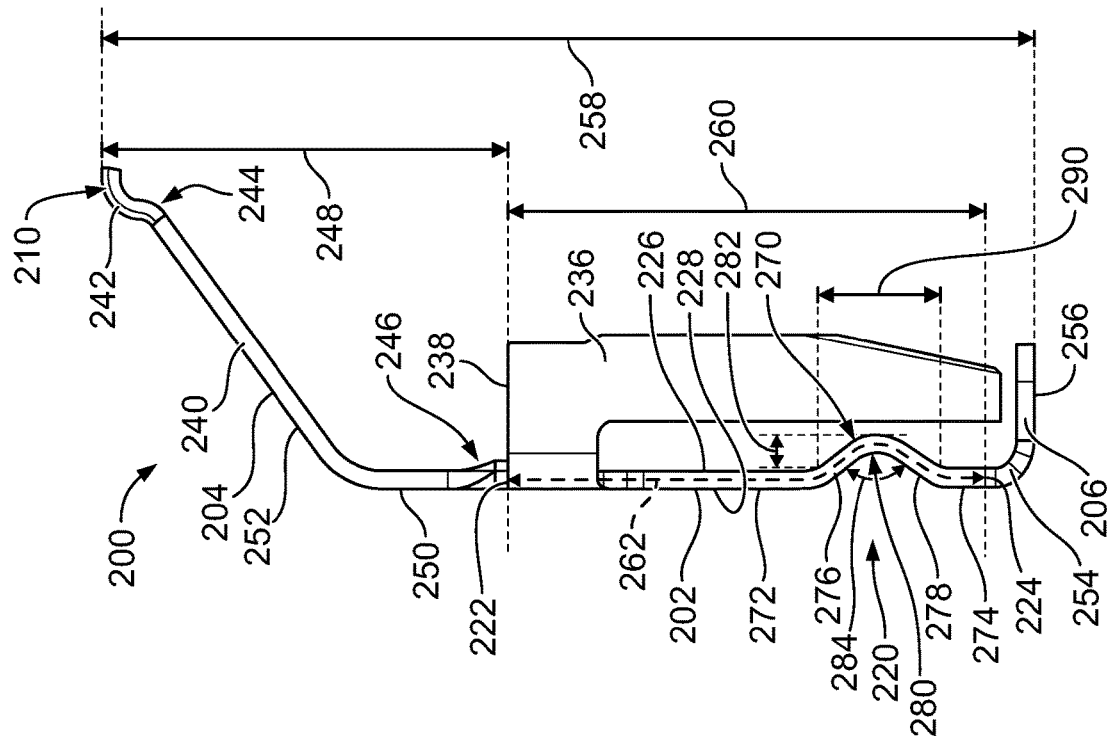
FIG. 10 is a side view of the data transmission contact in accordance with an exemplary embodiment.
Figure 9:
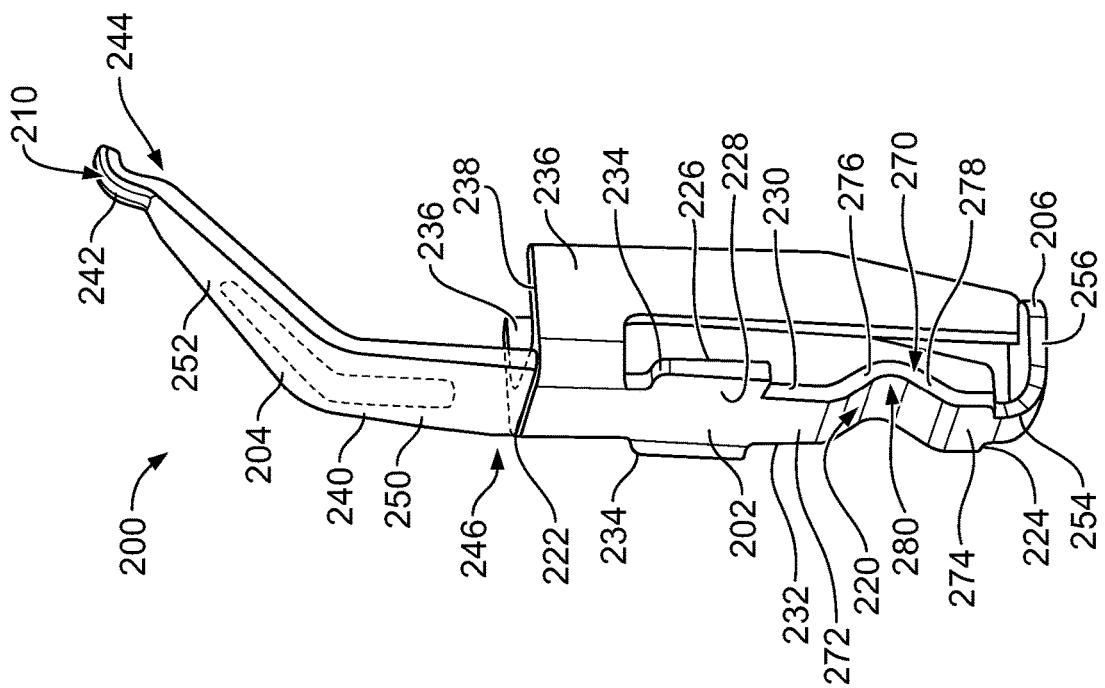
FIG. 9 is a rear perspective view of the data transmission contact in accordance with an exemplary embodiment.

FIG. 9 is a rear perspective view of the data transmission contact 200 in accordance with an exemplary embodiment. FIG. 10 is a side view of the data transmission contact 200 in accordance with an exemplary embodiment. The data transmission contact 200 includes the main body 202, the contact beam 204 extending from the main body 202, and the solder pad 206 extending from the main body 202. In an exemplary embodiment, the data transmission contacts 200 is a stamped and formed contact. The main body 202 is integral with the contact beam 204 and the solder pad 206 as a monolithic, unitary structure.

The data transmission contact 200 includes an adjustable height section 220 to vary the height of the data transmission contact 200, such as to control the location of the upper mating interface 210 (and/or the lower mating interface). In the illustrated embodiment, the adjustable height section 220 is provided along the main body 202 to control the height of the main body 202. For example, the adjustable height section 220 is located between a top 222 and a bottom 224 of the main body 202. A shape of the main body 202 at the adjustable height section 220 is configured to be manipulated during a forming process to change a height of the main body 202. For example, the adjustable height section 220 may be bent out of a main body plane of the main body 202 to adjust the height of the main body 202. In alternative embodiments, the adjustable height section 220 is located along the contact beam 204 to control the height of the contact beam 204.

The main body 202 includes a front 226 and a rear 228. In an exemplary embodiment, the front 226 is generally planar, other than at the adjustable height section 220 and the rear 228 is generally planar, other than at the adjustable height section 220. In an exemplary embodiment, the main body 202 is planar at the top 222 and at the bottom 224, with the bottom 224 of the main body 202 coplanar with the top 222 of the main body 202. The adjustable height section 220 is located remote from the top 222 and remote from the bottom 224. Other locations for the adjustable height section 220 are possible in alternative embodiments, such as at the top 222 transitioning into the contact beam 204 at the bottom 224 transitioning into the solder pad 206. In various alternative embodiments, multiple adjustable height sections 220 may be provided.

The main body 202 includes a first edge 230 and a second edge 232. The edges 230, 232 may be cut edges defined by the stamping process. The main body 202 includes one or more locating features 234 extending from the main body 202. The locating features 234 may extend from the edges 230, 232. The locating features 234 may be used to center the data transmission contact 200 in the contact channel 158 of the substrate 152 (shown in FIG. 8). The locating features 234 may remain within the main body plane of the main body 202, rather than being bent and formed out of the main body plane.

In an exemplary embodiment, the data transmission contact 200 includes one or more retention features 236 extending from the main body 202. The retention features 236 may extend from the edges 230, 232, such as forward of the front 226 of the main body 202. For example, the retention features 236 may be bent or formed perpendicular to the main body 202. The retention features 236 are configured to engage the substrate 152 in the contact channel 158 to locate and/or retain the data transmission contact 200 and the contact channel 158. In various embodiments, the retention features 236 are connected to the main body 202 at or near the top 222 of the main body 202. For example, in the illustrated embodiment, a top edge 238 of each retention feature 236 is co-planer with the top 222 of the main body 202. A loading device may engage the top 222 and the top edge 238 to press the data transmission contact 200 into the contact channels 158 during the stitching process until the top 222 and the top edge 238 are flush with the upper surface 154 of the substrate 152. Such loading procedure ensures that each of the data transmission contact 200 are positioned at the same vertical position within the substrate 152 such that each of the contact beams 204 are aligned with each other. For example, each of the separable mating interfaces 210 may be aligned with each other. The height of the main body 202 may be varied by adjusting the shapes of the adjustable height sections 220 to vary the vertical positions of the solder pads 206 relative to the contact beams 204 (for example, relative to the top 222 of the main body 202 and the top edge 238 of the retention feature 236), such as to match the expected warpage profile of the host circuit board 104.

In an exemplary embodiment, the contact beam 204 extends from the top 222 of the main body 202. The contact beam 204 includes an arm 240 and a finger 242 extending from the arm 240 at a distal end 244 of the contact beam 204. The finger 242 defines the separable mating interface 210. The arm 240 is cantilevered from the main body 202 at a proximal end 246 of the contact beam 204. The arm 240 is deflectable to position the finger 242 for mating with the component circuit board 106. For example, the arm 240 may be elastically deformed when the component circuit board 106 is compressed against the electrical connector assembly 100. In an exemplary embodiment, the arm 240 includes a first section 250 and a second section 252. The first section 250 extends from the main body 202 at the proximal end 246. The second section 252 extends from the first section 250 to the distal end 244. The finger 242 extends from the second section 252. The arm 240 is bent at the intersection of the first section 250 and the second section 252. The arm 240 may be deflectable at the bend between the first section 250 and second section 252. In the illustrated embodiment, the first section 250 extend generally vertically, such as co-planer with the main body 202. The second section 252 is angled in a forward direction from the first section 250. In various embodiments, the second section 252 of the angled at an angle between 30° and 60° relative to the first section 250. Other angles are possible in alternative embodiments.

Optionally, the arm 240 may include a slot (shown in phantom in FIG. 9) extending along the first section 250 and/or the second section 252. For example, the slot may span across the bend between the first section 250 and the second section 252. The slot may increase flexibility of the arm 240 at the bend.

The contact beam 204 has a beam height 248 defined between the proximal end 246 and the distal end 244. The beam height 248 may be adjusted by adjusting the length of the arm 240 and/or adjusting the shape of the arm 240 and/or adjusting the length of the finger 242 and/or adjusting the shape of the finger 242. For example, the length of the first section 250 and/or the second section 252 may be adjusted. The angle of the bend between the first section 250 and the second section 252 may be adjusted.

In an exemplary embodiment, the solder pad 206 extends from the bottom 224 of the main body 202. The solder pad 206 includes a tail 254 extending from the main body 202. The tail 254 may have a necked down region having a narrower with along the necked down region. For example, the tail 254 may be narrower than the main body 202 at the bottom 224. The tail 254 may be necked down for impedance control through the tail 254. The tail 254 may be necked down (i.e., narrowed in width) to increase flexibility and control forming or bending at the tail 254 to position the solder pad 206 relative to the main body 202. In an exemplary embodiment, the solder pad 206 is oriented generally perpendicular to the main body 202. For example, the solder pad 206 is bent forward such that the solder pad 206 extends generally horizontally for receiving the solder ball 208 (shown in FIG. 8). The solder pad 206 may be located vertically below the retention features 236 and the contact beam 204. For example, each of the solder pad 206, the contact beam 204, and the retention features 236 may extend forward of the main body 202. The solder pad 206 includes a bottom surface 256 that is downward facing for receiving the solder ball 208. The bottom surface 256 is located at the bottom of the data transmission contact 200. In various embodiments, solder balls 208 having different diameters may be provided to vary the positions of the solder balls 208 in the array (for example, to match a warpage profile of the host circuit board 104).

The data transmission contact 200 has a contact height 258 defined between the bottom surface 256 and the separable mating interface 210 at the distal end 244 of the contact beam 204. The contact height 258 may be varied by adjusting a height 260 of the main body 202 and/or the height of the solder pad 206 and/or the beam height 248 of the contact beam 204. For example, the height 260 of the main body 202 may be adjusted by the adjustable height section 220.

The adjustable height section 220 is located along the main body 202 to change the height 260 of the main body 202. The height 260 is defined between the top 222 and the bottom 224 of the main body 202. By varying the height of the adjustable height section 220, the height 260 of the main body 202 may be varied. In an exemplary embodiment, the main body 202 has a main body length 262 between the top 222 and the bottom 224. The main body length 262 is the path length of the main body 202 between the top 222 and the bottom 224. Because the main body 202 is nonplanar, the main body length 262 is longer than the height 260 of the main body 202. The main body length 262 is longer than the height 260 based on the shape of the adjustable height section 220. In an exemplary embodiment, each of the data transmission contacts 200 within the electrical connector assembly 100 are stamped from a metal sheet to have the same main body length 262. The heights 260 of the main bodies 202 are varied by varying the shape of the adjustable height sections 220 to adjust vertical positions of the solder pads 206 relative to the contact beams 204.

The adjustable height section 220 of the main body 202 includes a jogged section 270 transitioning the main body 202 out of the main body plane. The shape of the jogged section 270 is controlled during the forming process or to vary the height 260 of the main body 202. In an exemplary embodiment, the jogged section 270 has a serpentine shape transitioning into and out of an upper section 272 and a lower section 274 of the main body 202. The jogged section 270 extends forward of the upper section 272 and the lower section 274. In an exemplary embodiment, the jogged section 270 is chevron shaped or V-shaped, including a first arm 276 and a second arm 278 meeting at a corner 280. The first arm 276 extends from the upper section 272 to the corner 280. The second arm 278 extends from the lower section 274 to the corner 280. The jogged section 270 may be flexible. For example, the jogged section 270 may be compressed when the contact 200 is received between the circuit boards 104, 106. The jogged section 270 may define a crumple zone for the contact 200 for mating with the circuit boards 104, 106. In alternative embodiments, rather than the jogged section 270, the adjustable height section may include an opening punched in the main body 202 that allows the main body 202 to collapse vertically to vary the height of the main body 202.

The jogged section 270 may be formed by pressing the adjustable height section 220 forward at the corner 280 during a forming process. For example, a forming tool may press against the rear 228 of the main body 202 to form the jogged section 270. The jogged section 270 has a jogged section depth 282 defined from the main body plane to the corner 280. The height 260 of the main body 202 is controlled by controlling the jogged section depth 282. The corner 280 has an angle 284 between the first arm 276 and the second arm 278. The height 260 of the main body 202 may be adjusted by controlling the angle 284 between the first arm 276 and the second arm 278. The height 260 of the main body 202 is controlled by controlling a first arm length of the first arm 276 and a second arm length of the second arm 278. For example, the arm lengths and the angle 284 defines the shape of the jogged section 270. Varying the shape of the jogged section 270 controls an adjustable height section height 290 of the adjustable height section 220 adjust the height 260 of the main body 202.

Figure 11:
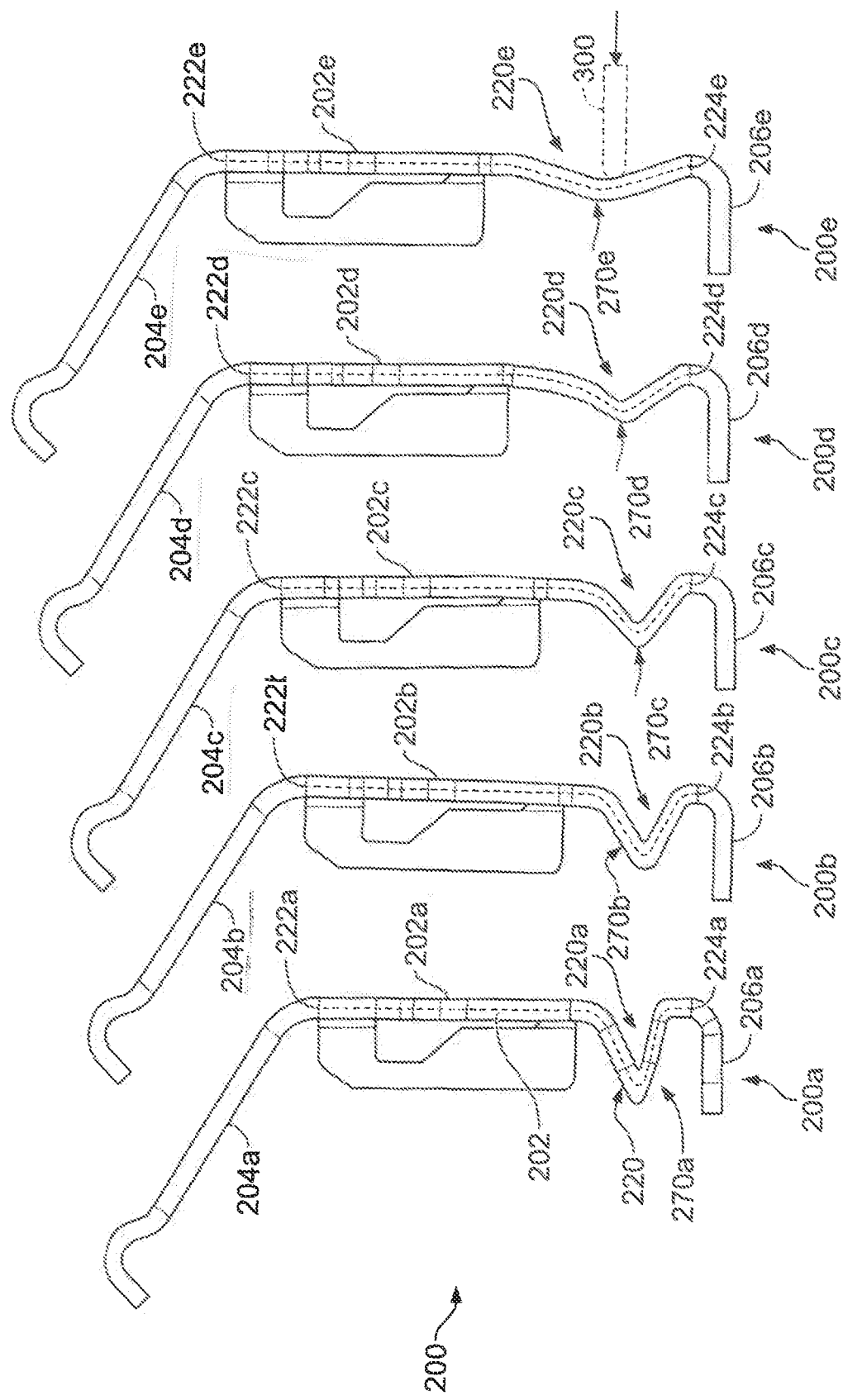
FIG. 11 illustrates an array of the data transmission contacts in accordance with an exemplary embodiment.

FIG. 11 illustrates an array of the data transmission contacts 200 in accordance with an exemplary embodiment. The array includes a first data transmission contact 200a, a second data transmission contact 200b, a third data transmission contact 200c, a fourth data transmission contact 200d, and a fifth data transmission contact 200e. Each of the data transmission contacts 200a-200e have different contact heights 258 (shown in FIG. 10). For example, the adjustable height sections 220a-220e have different heights, leading to varying of the heights 260 (shown in FIG. 10) of the main bodies 202a-202e, and thus the different contact heights 258. In various embodiments, the array may include additional contacts, such as multiple first data transmission contacts 200a, and/or multiple second data transmission contact 200b, and/or multiple third data transmission contact 200c, and/or multiple fourth data transmission contact 200d, and/ or multiple a fifth data transmission contact 200e. Within a given row or column of the data transmission contacts 200 in the array, there may be provided multiple data transmission contacts 200 of one height before transitioning to multiple data transmission contacts 200 of another height. The data transmission contacts 200a-200e may be arranged in any order within a row or a column within the array.

In an exemplary embodiment, the bottoms 224a-224e are all coplanar to align the solder pads 206a-206e. The tops 222a-222e of the main bodies 202a-202e may be offset to vary the vertical positions of the contact beams 204a-204e relative to each other. As such, the solder pads 206a-206e may be positioned in the array to match the expected curvature or warpage profile of the component circuit board 106 (shown in FIG. 4). In an alternative embodiment, the tops 222a-222e may be all coplanar to align the contact beams 204a-204e. In other various embodiments, the main bodies 202a-202e may be positioned within the substrate such that tops 222a-222e are offset from each other to vary the vertical positions of the mating interfaces of the contact beams 204a-204e relative to each other. As such, the contact beams 204a-204e may be positioned in the array to match the expected curvature or warpage profile of the component circuit board 106 (shown in FIG. 3).

In an exemplary embodiment, each of the data transmission contacts 200a-200e has the same main body length 262 (shown in FIG. 10); however, the heights 260 are different. The shapes of the adjustable height sections 220 are different to vary and adjust the heights 260 of the main bodies 202. For example, the jogged sections 270a-270e may have different depths and/or different angles and/or different arm lengths of the upper and lower arms of the jogged sections 270a-270e. The jogged sections 270a-270e are formed differently, such as by varying the pressing amount and/or the pressing pressure and/or the pressing location of a forming tool 300 when forming the jogged sections 270a-270e. As such, even though each of the data transmission contacts 200a-200e are stamped in the same shape (for example, same main body length 262), the data transmission contacts 200a-200e have variable or adjustable heights. The electrical connector assembly 100 is capable of being manufactured with contacts made from the same stamping die, without needing different stamping dies to achieve variable height contacts.

Figure 12:
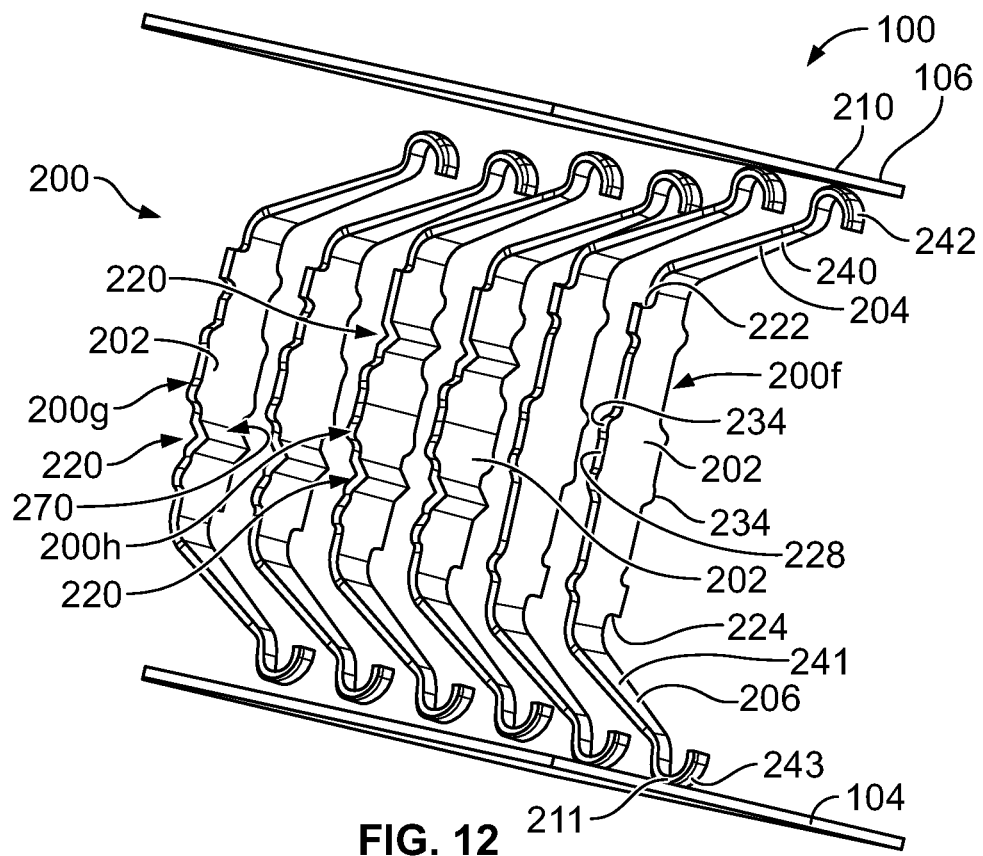
FIG. 12 illustrates an array of the data transmission contacts in accordance with an exemplary embodiment.
Figure 13:
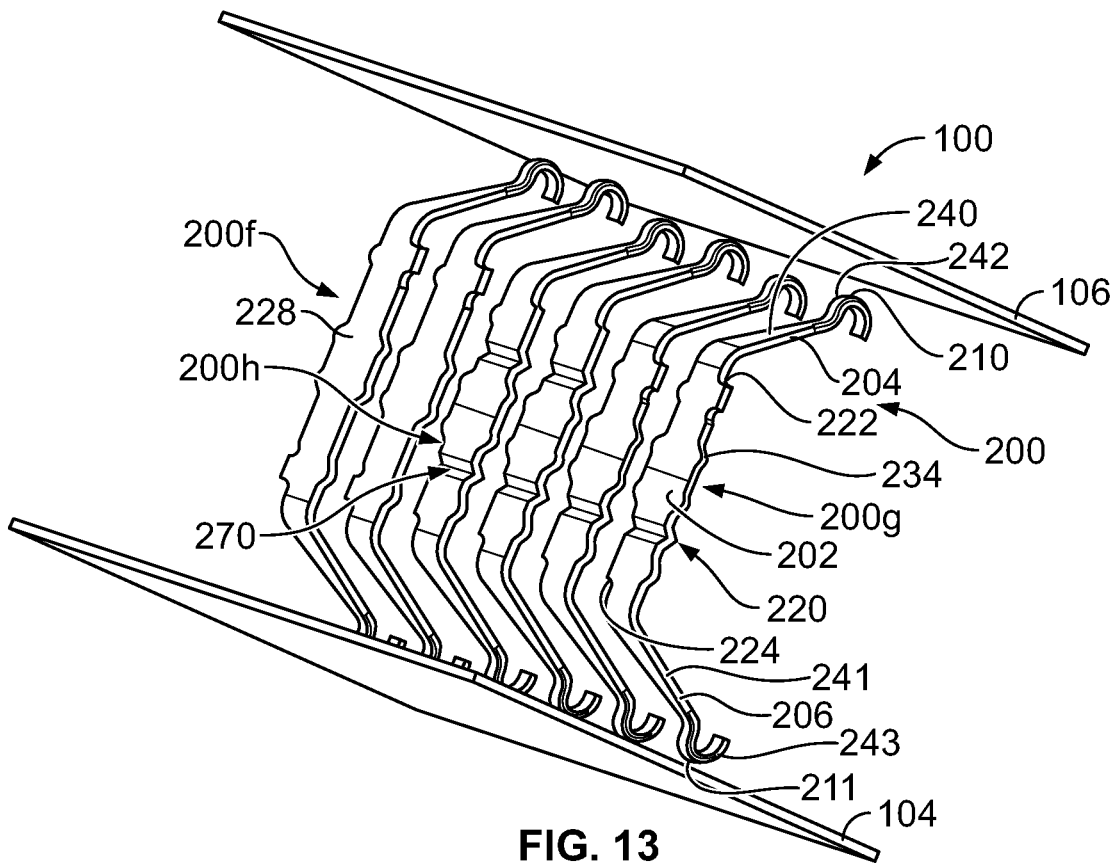
FIG. 13 illustrates an array of the data transmission contacts in accordance with an exemplary embodiment.
Figure 14:
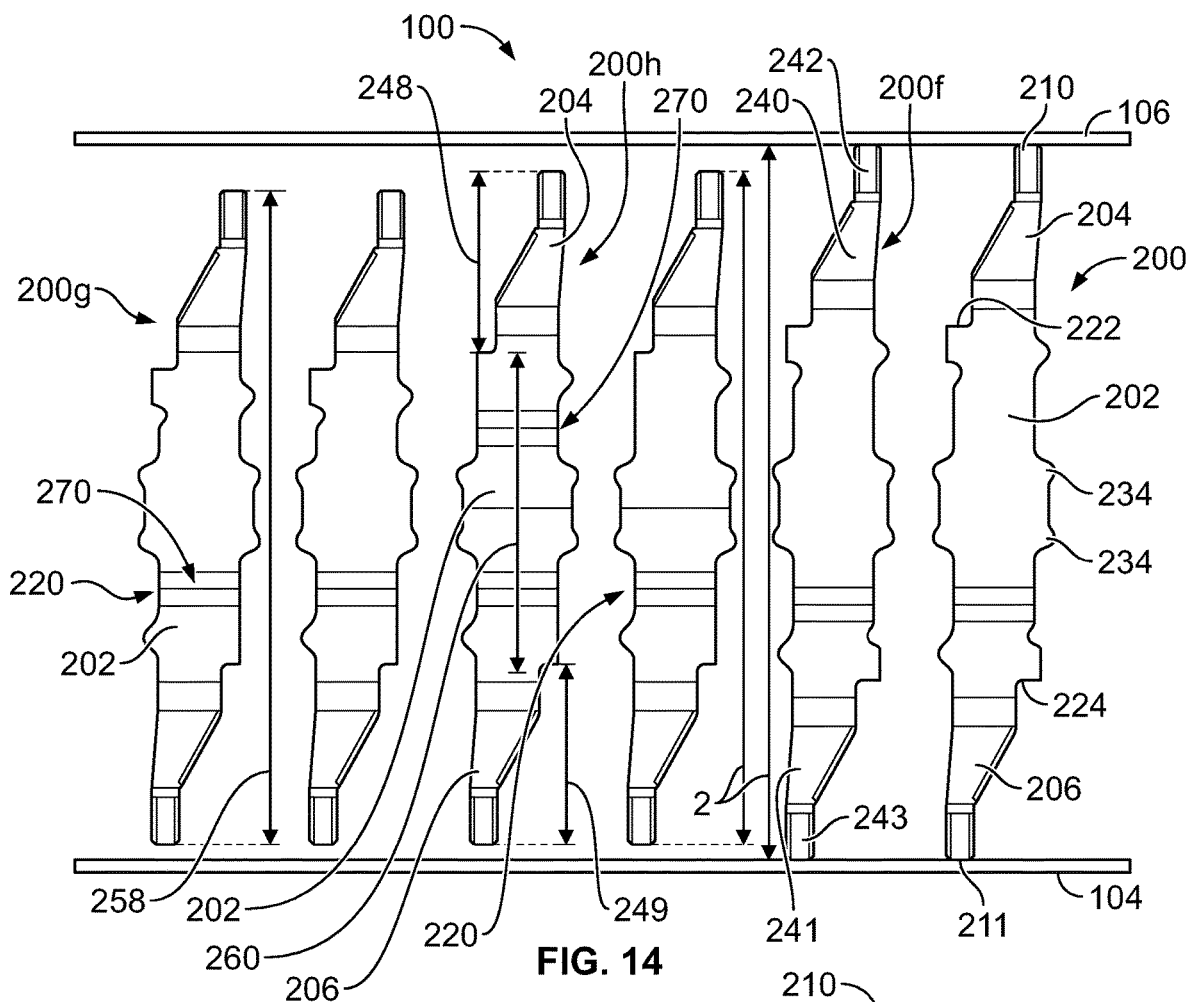
FIG. 14 illustrates an array of the data transmission contacts in accordance with an exemplary embodiment.
Figure 15:
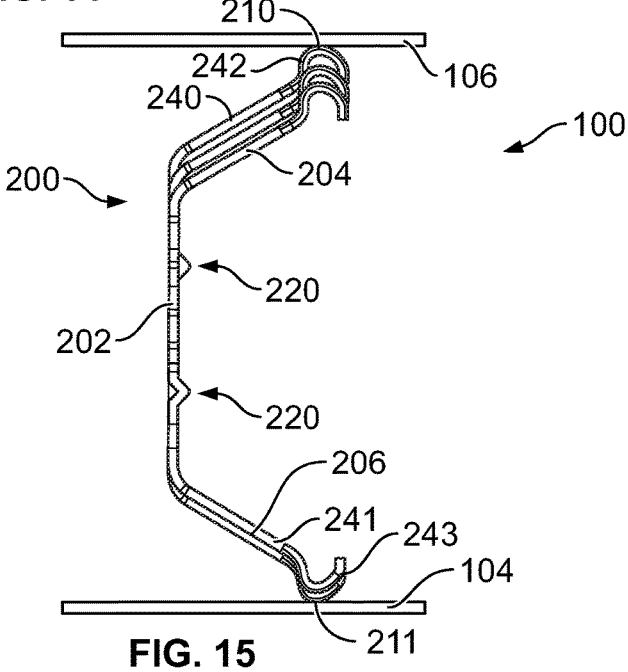
FIG. 15 illustrates an array of the data transmission contacts in accordance with an exemplary embodiment.

FIG. 12 is a front perspective view of a portion of the electrical connector assembly 100 in accordance with an exemplary embodiment. FIG. 13 is a rear perspective view of a portion of the electrical connector assembly 100 in accordance with an exemplary embodiment. FIG. 14 is a front view of a portion of the electrical connector assembly 100 in accordance with an exemplary embodiment. FIG. 15 is a side view of a portion of the electrical connector assembly 100 in accordance with an exemplary embodiment. FIGS. 12-15 illustrates an array of the data transmission contacts 200 in accordance with an exemplary embodiment. The data transmission contacts 200 are configured to be received in corresponding contact channels of the substrate 152 (shown in FIG. 8). In the illustrated embodiment, the data transmission contacts 200 have contact beams at the upper interface and the lower interface defining the upper mating elements 204 and the lower mating elements 206 rather than having a BGA of solder balls at the lower mating interface. The upper mating elements 204 may be referred to hereinafter as contact beams 204 and the lower mating elements 206 may be referred to hereinafter as contact beams 206.

The data transmission contacts 200 each include the main body 202, the contact beam 204 extending from the main body 202, and the contact beam 206 extending from the main body 202. In an exemplary embodiment, the data transmission contacts 200 is a stamped and formed contact with the main body 202 being integral with the contact beam 204 and the contact beam 206 as a monolithic, unitary structure.

The main body 202 includes at least one adjustable height section 220 located between a top 222 and a bottom 224 of the main body 202. A shape of the main body 202 at the adjustable height section(s) 220 is configured to be manipulated during a forming process to change a height of the main body 202, which adjusts the position of the upper contact beam 204 and/or the lower contact beam 206. The adjustable height section 220 may be bent out of a main body plane of the main body 202 to adjust the height of the main body 202 and control the position of the upper contact beam 204 and/or the lower contact beam 206. The adjustable height section 220 is located remote from the top 222 of the main body 202 and remote from the bottom 224 of the main body 202. Other locations for the adjustable height section 220 are possible in alternative embodiments, such as at the top 222 transitioning into the contact beam 204 or at the bottom 224 transitioning into the contact beam 206. In an alternative embodiment, the adjustable height section 220 may be provided along the upper contact beam 204 or the lower contact beam 206.

In an exemplary embodiment, the contact beam 204 extends from the top 222 of the main body 202. The contact beam 204 includes the arm 240 and the finger 242 extending from the arm 240. The adjustable height section 220 may be provided along the arm 240, such as between the finger 242 and the main body 202 to adjust the vertical position of the finger 242 relative to the main body 202 and thus vary the overall height of the contact beam 204. The finger 242 defines the separable mating interface 210. The arm 240 is cantilevered from the main body 202 and is deflectable to position the finger 242 for mating with the component circuit board 106. Optionally, the arm 240 may include a slot to increase flexibility of the arm 240. In various embodiments, the beam height 248 of the contact beam 204 may be adjusted by providing the adjustable height section 220 (for example, above the locating features 234 of the main body 202). The beam height 248 may be adjusted by adjusting the length of the arm 240 and/or adjusting the shape of the arm 240 and/or adjusting the length of the finger 242 and/or adjusting the shape of the finger 242. The angle of the bend in the arm 240 may be adjusted to adjust the beam height 248.

In an exemplary embodiment, the contact beam 206 extends from the bottom 224 of the main body 202. The contact beam 206 includes an arm 241 and the finger 243 extending from the arm 241. The finger 243 defines a separable mating interface 211. The arm 241 is cantilevered from the main body 202 and is deflectable to position the finger 243 for mating with the host circuit board 104. Optionally, the arm 241 may include a slot to increase flexibility of the arm 241. In various embodiments, a beam height 249 of the contact beam 206 may be adjusted by providing the adjustable height section 220 (for example, below the locating features 234 of the main body 202). The beam height 249 may be adjusted by adjusting the length of the arm 241 and/or adjusting the shape of the arm 241 and/or adjusting the length of the finger 243 and/or adjusting the shape of the finger 243. The angle of the bend in the arm 241 may be adjusted to adjust the beam height 249.

The data transmission contact 200 has a contact height 258 (FIG. 14) defined between the lower separable mating interface 211 and the upper separable mating interface 210. The contact height 258 may be varied by adjusting the height 260 of the main body 202 and/or the beam height 249 of the contact beam 206 and/or the beam height 248 of the contact beam 204. For example, the height 260 of the main body 202 may be adjusted by the adjustable height section(s) 220.

The adjustable height section 220 is located along the main body 202 to change the height 260 of the main body 202. For example, the jogged section(s) 270 transition the main body 202 out of the main body plane to adjust the height 260. The height 260 is defined between the top 222 and the bottom 224 of the main body 202. By varying the height of the adjustable height section 220, the height 260 of the main body 202 may be varied. By positioning the adjustable height section 220 above the locating features 234, the upper contact beam 204 may be moved downward toward the substrate 152. By positioning the adjustable height section 220 below the locating features 234, the lower contact beam 206 may be moved upward toward the substrate 152. By positioning the adjustable height sections 220 both above and below the locating features 234, the upper and lower contact beams 204, 206 are both moved toward the substrate 152. In an exemplary embodiment, each of the data transmission contacts 200 within the electrical connector assembly 100 are stamped from a metal sheet to have the same main body length; however, the heights 260 of the main bodies 202 are varied by varying the shape of the adjustable height sections 220 to adjust vertical positions of the contact beams 204 and/or the contact beams 206.

In an exemplary embodiment, the shape of the main body 202 may be deformed or modified during the forming process or to vary the height 260 of the main body 202. For example, the jogged section(s) 270 may be formed, such as into a V-shape. The jogged section 270 may be formed by pressing the adjustable height section 220 during a forming process using a forming tool to press against the rear 228 of the main body 202 to form the jogged section 270. The depths of the jogged sections 270 may be varied from contact to contact to provide contacts 200 having different heights. Varying the shape of the jogged section 270 controls a height of the adjustable height section 220 to adjust the height 260 of the main body 202.

FIGS. 12-15 illustrate an array of the data transmission contacts 200 including first data transmission contacts 200$f$, second data transmission contacts 200$g$, third data transmission contacts 200$h$. The data transmission contacts 200$f$, 200$g$, 200$h$ have different contact heights 258. For example, the adjustable height sections 220$f$, 220$g$, 220$h$ have different heights. Any number of the data transmission contacts 200$f$-200$h$ may be provided in the contact array. The data transmission contacts 200$f$-200$h$ may be arranged in any order within a row or a column within the array. In the illustrated embodiments, the upper mating interfaces 210 are shown as being variable (for example, non-coplanar) and the lower mating interfaces 211 are shown as being variable (for example, non-coplanar). However, in alternative embodiments, the data transmission contacts 200 may be arranged such that the lower mating interfaces 211 are coplanar (or such that the upper mating interfaces 210 are coplanar).

In an exemplary embodiment, the first data transmission contacts 200$f$ are full height contacts, devoid of adjustable height sections 220. The second data transmission contacts 200$g$ include adjustable height sections 220, such as proximate to the tops of the main bodies 202 or proximate to the bottoms of the main bodies 202. The adjustable height sections 220 operate to lower the upper contact beams 204 or raise the lower contact beams 206. In various embodiments, the main bodies 202 of the second data transmission contacts 200$g$ may have shortened main bodies 202 to lower the upper contact beams 204 or raise the lower contact beams 206. The third data transmission contact 200$h$ include adjustable height sections 220 at both the upper and lower sections of the main bodies 202. The adjustable height sections 220 operate to lower the upper contact beams 204 and raise the lower contact beams 206. The adjustable height sections 220 vary the vertical positions of the upper mating interfaces 210 and/or the lower mating interfaces 211.

The shapes of the adjustable height sections 220 may be adjusted to vary and adjust the heights. For example, the jogged sections 270 may have different depths and/or different angles and/or different lengths of the upper and lower arms of the jogged sections 270. The jogged sections 270 may be formed differently, such as by varying the pressing amount and/or the pressing pressure and/or the pressing location of a forming tool when forming the jogged sections 270. As such, even though each of the data transmission contacts 200f, 200g, 200h are stamped in the same shape, the data transmission contacts 200f, 200g, 200h have variable or adjustable heights. The electrical connector assembly 100 is capable of being manufactured with contacts made from the same stamping die, without needing different stamping dies to achieve variable height contacts.

The above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A board-to-board electrical connector assembly for electrically connecting a component circuit board of an electrical component having an expected non-coplanar warpage profile with a host circuit board, the board-to-board electrical connector comprising:
   a contact organizer having a substrate including an upper surface and a lower surface, the lower surface configured to face the host circuit board, the upper surface configured to face the component circuit board, the substrate including a plurality of contact channels extending between the upper surface and the lower surface;
   data transmission contacts received in corresponding contact channels, each data transmission contact including a main body extending between a top and a bottom, an upper mating element extending from the top of the main body to an upper mating interface configured to be mated to the component circuit board, and a lower mating element extending from the bottom of the main body to a lower mating interface configured to be mated to the host circuit board, the data transmission contacts have variable heights such that the upper mating interfaces are non-coplanar to correspond to the expected non-coplanar warpage profile of the component circuit board.

2. The board-to-board electrical connector assembly of claim 1, wherein heights of the upper mating elements may be varied to vary positions of the upper mating interfaces to correspond to the warpage profile of the component circuit board.

3. The board-to-board electrical connector assembly of claim 1, wherein vertical positions of the upper mating elements are set at different heights using tooling.

4. The board-to-board electrical connector assembly of claim 1, wherein the data transmission contact includes an adjustable height section between the upper mating interface and the lower mating interface to adjust a height of the data transmission contact, wherein the adjustable height sections of the data transmission contacts are varied to adjust vertical positions of the upper mating elements.

5. The board-to-board electrical connector assembly of claim 4, wherein the adjustable height sections have different shapes to vary vertical positions of the upper mating elements relative to the lower mating elements.

6. The board-to-board electrical connector assembly of claim 1, wherein the main body including a main body length between the top and the bottom, the main body includes an adjustable height section between the top and the bottom of the main body to adjust a height of the main body between the top and the bottom, wherein the adjustable height sections of the data transmission contacts are varied to adjust vertical positions of the upper mating elements.

7. The board-to-board electrical connector assembly of claim 6, wherein the data transmission contacts have the same main body lengths, the heights of the main bodies being adjustable by varying shapes of the adjustable height sections to adjust vertical positions of at least one of the upper mating element or the lower mating element.

8. The board-to-board electrical connector assembly of claim 6, wherein the adjustable height section of each main body includes a jogged section transitioning the main body out of a main body plane of the main body, a shape of the jogged section being controlled during a forming process to vary the height of the main body.

9. The board-to-board electrical connector assembly of claim 1, wherein the data transmission contacts are arranged in a first contact array and a second contact array, the data transmission contacts in the first contact array having a first height, the data transmission contacts in the second contact array having a second height different than the first height.

10. The board-to-board electrical connector assembly of claim 1, wherein the data transmission contacts have variable heights such that the lower mating interfaces are non-coplanar to correspond to an expected non-coplanar warpage profile of the host circuit board.

11. A board-to-board electrical connector assembly for electrically connecting a component circuit board of an electrical component with a host circuit board, the board-to-board electrical connector comprising:
    a contact organizer having a substrate including an upper surface and a lower surface, the lower surface configured to face the host circuit board, the upper surface configured to face the component circuit board, the substrate including a plurality of contact channels extending between the upper surface and the lower surface;
    data transmission contacts received in corresponding contact channels, each data transmission contact including a main body extending between a top and a bottom, an upper mating element extending from the top of the main body configured to be mated to the component circuit board at a mating interface, and a lower mating element extending from the bottom of the main body configured to be mated to the host circuit board, the main body including a main body length between the top and the bottom, the main body includes an adjustable height section between the top and the bottom of the main body to adjust a height of the main body between the top and the bottom;

wherein the adjustable height sections of the data transmission contacts are varied to adjust vertical positions of at least one of the upper mating element or the lower mating element such that the contacts have variable heights.

12. The board-to-board electrical connector assembly of claim 11, wherein the adjustable height sections of the main bodies of the data transmission contacts have different shapes to vary vertical positions of the upper mating elements relative to the lower mating elements.

13. The board-to-board electrical connector assembly of claim 11, wherein the data transmission contacts have the same main body lengths, the heights of the main bodies being adjustable by varying shapes of the adjustable height sections to adjust vertical positions of at least one of the upper mating element or the lower mating element.

14. The board-to-board electrical connector assembly of claim 11, wherein the adjustable height section of each main body includes a jogged section transitioning the main body out of a main body plane of the main body, a shape of the jogged section being controlled during a forming process to vary the height of the main body.

15. The board-to-board electrical connector assembly of claim 11, wherein the adjustable height section of each main body includes a jogged section, the height of each main body being varied by varying a shape of the jogged section relative to other jogged sections of other data transmission contacts.

16. The board-to-board electrical connector assembly of claim 11, wherein the adjustable height section is chevron shaped including a first arm and a second arm meeting at a corner.

17. The board-to-board electrical connector assembly of claim 16, wherein the height of the main body is adjusted by controlling an angle between the first arm and the second arm.

18. The board-to-board electrical connector assembly of claim 16, wherein the height of the main body is adjusted by controlling a first arm length of the first arm a second arm length of the second arm.

19. The board-to-board electrical connector assembly of claim 11, wherein the adjustable height section of each main body includes a jogged section having a jogged section depth, the height of each main body being adjusted by varying the jogged section depth such that different data transmission contacts having different jogged section depths having different heights of the main bodies.

20. The board-to-board electrical connector assembly of claim 11, wherein the data transmission contacts are arranged in a contact array, the data transmission contacts being arranged in the contact array based on the heights of the main bodies to control vertical positions of at least one of the upper mating element or the lower mating element to correspond to a warpage profile of the host circuit board.

21. The board-to-board electrical connector assembly of claim 11, wherein the data transmission contacts are arranged in a first contact array and a second contact array, the data transmission contacts in the first contact array having a first height, the data transmission contacts in the second contact array having a second height different than the first height.

22. The board-to-board electrical connector assembly of claim 21, wherein the data transmission contacts are further arranged in a third contact array, the data transmission contacts in the third contact array having a third height different than the first height and different than the second height.

23. The board-to-board electrical connector assembly of claim 11, wherein the data transmission contacts are arranged in a first contact array and a second contact array, all of the data transmission contacts in the first contact array having heights in a first height range and all of the contacts in the second contact array having heights in a second height range nonoverlapping with the first height range.

24. The board-to-board electrical connector assembly of claim 11, wherein each data transmission contact includes a retention feature extending from the main body, the retention feature engaging the contact organizer to position the data transmission contact relative to the contact organizer, the adjustable height section located between the retention feature and the upper mating element to adjust a vertical position of the upper mating element relative to the retention feature to adjust a contact height of the data transmission contact.

25. A board-to-board electrical connector assembly for electrically connecting a component circuit board of an electrical component with a host circuit board, the board-to-board electrical connector comprising:

a contact organizer having a substrate including an upper surface and a lower surface, the lower surface configured to face the host circuit board, the upper surface configured to face the component circuit board, the substrate including a plurality of contact channels extending between the upper surface and the lower surface;

a first data transmission contact received in the corresponding contact channel, the first data transmission contact including a first main body extending between a top and a bottom, a first upper mating element extending from the top of the first main body configured to be mated to the component circuit board at a first mating interface, and a first lower mating element extending from the bottom of the first main body configured to be mated to the host circuit board, the first main body having an adjustable height section between the top and the bottom, the adjustable height section including a first jogged section that transitions out of a main body plane of the first main body, the first jogged section having a first depth to control a first height of the first main body between the top and the bottom; and a second data transmission contact received in the corresponding contact channel, the second data transmission contact including a second main body extending between a top and a bottom, a second upper mating element extending from the top of the second main body configured to be mated to the component circuit board at a second mating interface, and a second lower mating element extending from the bottom of the second main body configured to be mated to the host circuit board, the second main body having an adjustable height section between the top and the bottom, the adjustable height section including a second jogged section that transitions out of a main body plane of the second main body, the second jogged section having a second depth to control a second height of the second main body between the top and the bottom;

wherein the first depth of the first jogged section is deeper than the second depth of the second jogged section such that a first height of the first main body is shorter than a second height of the second main body.

26. The board-to-board electrical connector assembly of claim 25, wherein the first adjustable height section of the first main body has a different shape than the second adjustable height section of the second main body to vary the first height compared to the second height.

27. The board-to-board electrical connector assembly of claim 25, wherein the first main body has a first main body length along the first main body between the top and the bottom and wherein the second main body has a second main body length along the second main body between the top and the bottom, the first main body length being equal to the second main body length.

28. The board-to-board electrical connector assembly of claim 25, wherein the first adjustable height section is chevron shaped including an upper arm and a lower arm meeting at a first corner, the first depth defined by a distance of the first corner from the main body plane of the first main body, wherein the second adjustable height section is chevron shaped including an upper arm and a lower arm meeting at a second corner, the second depth defined by a distance of the second corner from the main body plane of the second main body, and wherein the chevron shaped first adjustable height section is shaped differently than the chevron shaped second adjustable height section.

29. The board-to-board electrical connector assembly of claim 28, wherein the first corner has a first angle between the upper arm and the lower arm of the first adjustable height section and wherein the second corner has a second angle between the upper arm and the lower arm of the second adjustable height section, the first angle being different than the second angle.

30. A data transmission contact comprising: a generally planar main body extending between a top and a bottom along a main body plane; a upper mating element extending from the main body at the top of the main body, the upper mating element having a proximal end at the main body and a distal end opposite the proximal end, the upper mating element having a mating interface at the distal end configured to be mated to an electrical component; a lower mating element extending from the main body at the bottom of the main body, the lower mating element configured to be mated to a board contact on a surface of a host circuit board; and an adjustable height section located at one of the top or the bottom of the main body, the adjustable height section having a transition that transitions out of the main body plane of the main body, wherein a shape of the transition is controlled during a forming process to vary a height of data transmission contact to adjust relative positions of the upper mating element and the lower mating element, wherein the main body has a portion that is wider than a portion of the upper mating element and the lower mating element.

* * * * *